United States Patent
Herbsommer et al.

(10) Patent No.: US 8,431,979 B2
(45) Date of Patent: Apr. 30, 2013

(54) POWER CONVERTER HAVING INTEGRATED CAPACITOR

(75) Inventors: Juan A Herbsommer, Schnecksville, PA (US); Osvaldo J Lopez, Annandale, NJ (US); Jonathan A Noquil, Bethlehem, PA (US); David Jauregui, Bethlehem, PA (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 13/078,112

(22) Filed: Apr. 1, 2011

(65) Prior Publication Data
US 2012/0248521 A1    Oct. 4, 2012

(51) Int. Cl.
*H01L 27/108* (2006.01)
(52) U.S. Cl.
USPC .................................. 257/299; 257/E27.011
(58) Field of Classification Search .................. 257/299
See application file for complete search history.

(56) References Cited

U.S. PATENT DOCUMENTS 8,062,932 B2 * 11/2011 Hebert et al. ................. 438/121
2009/0212405 A1 * 8/2009 Liu et al. ........................ 257/670

* cited by examiner

*Primary Examiner* — Kimberly Rizkallah
*Assistant Examiner* — Timor Karimy
(74) *Attorney, Agent, or Firm* — Steven A. Shaw; W. James Brady; Frederick J. Telecky, Jr.

(57) ABSTRACT

A power supply module (400) comprising a metal leadframe with a pad (401) and a first metal clip (440) including a plate (440*a*), an extension (440*b*) and a ridge (440*c*); the plate and extension are spaced from the leadframe pad, and the ridge connected to an input supply. A synchronous Buck converter is in the space between the clip plate and the leadframe pad, the converter including a control FET die (410) soldered onto a sync FET die (420), the clip plate soldered to the control die having an input inductance (462), and the sync die soldered to the leadframe pad having an output capacitance. A capacitor (480*a*, 480*b*) integrated into the space between the clip extension and the leadframe pad, the clip extension soldered to the capacitor having a desired integrated inductance (463) operable to channel electrical energy from the switch node to ground.

18 Claims, 6 Drawing Sheets

POWER CONVERTER HAVING INTEGRATED CAPACITOR

FIELD OF THE INVENTION

The present invention is related in general to the field of semiconductor devices and processes, and more specifically to the system structure and fabrication method of a power supply module having an integrated capacitor to operate at high frequency with much reduced switch node ringing.

DESCRIPTION OF RELATED ART

Among power switching devices are the DC-DC power converters including Switched Mode Power Supply circuits. Particularly suitable for the emerging power delivery requirements are the synchronous Buck converters with two power MOS field effect transistors (FETs) connected in series and coupled together by a common switch node. In the Buck converter, the control FET die, also called the high side switch, is connected between the supply voltage $V_{IN}$ and the LC output filter, and the synchronous (sync) FET die, also called the low side switch, is connected between the LC output filter and the ground (the sync FET works as a synchronous rectifier substituting for a free wheeling diode).

The gates of the control FET die and the sync FET die are connected to a semiconductor chip including an integrated circuit (IC) acting as the driver of the converter, and the driver, in turn, is connected to a controller IC. Preferably, both ICs are integrated on a single chip.

The inductor of the output circuitry serves as the energy storage of the power supply circuit. Consequently, the inductor has to be a large enough component (typical sizes are 300 to 400 nH) to reliably function for maintaining a constant output voltage $V_{OUT}$.

For many of today's power switching devices, the dies of the power MOSFETs and the chip of the driver and controller IC are assembled as individual components. Each die and the chip are typically attached to a rectangular shaped pad of a metallic leadframe; and the pad is surrounded by leads as input or output terminals. The leads are commonly shaped without cantilever extensions, and arranged in the manner of Quad Flat No-Lead (QFN) or Small Outline No-Lead (SON) devices. The electrical connections from the dies and the chip to the leads are provided by bonding wires, which add, due to their lengths and resistances, significant parasitic inductance into the circuit. Each assembly is typically packaged in a plastic encapsulation, and the packaged components are employed as discrete building blocks for board assembly of power supply systems.

In other power switching devices, the power MOSFET dies and the driver-and-controller IC are assembled horizontally side-by-side on a leadframe pad, which in turn is surrounded on all four sides by leads serving as device terminals. The leads are shaped in QFN or SON fashion. The electrical connections between the dies, the chip, and the leads are provided by bonding wires (made of gold), which add, due to their lengths and resistances, significant parasitic inductance into the circuit. The devices are packaged in a plastic encapsulation.

In some recently introduced advanced assemblies, clips made of copper substitute for many connecting wires. These clips add less parasitic inductance than do wires.

In another recently introduced scheme, the control FET die and the sync FET die are assembled vertically on top of each other in a stack, with the physically larger-area die of the two attached to the leadframe pad, and with clips providing the connections to the switch node and the stack top. The sync die is assembled onto the leadframe pad and the control die has its drain tied to the input supply $V_{IN}$. A clip is connected to the switch node between the two dies. The pad is connected to ground potential and serves as a spreader of operationally generated heat; the top clip is tied to input supply $V_{IN}$.

SUMMARY OF THE INVENTION

Applicants analyzed DC-DC power supply systems built with synchronous Buck converters stacking a control power MOSFET die on top of a sync power MOS FET die. The source of the sync die is attached on the leadframe pad, which allows the pad to be at ground potential and to act as heat spreader to be connected to a heat sink in the substrate. This converter operates efficiently at a frequency of 500 kHz up to 1 MHz.

Systems so configured, however, have a serious problem in that during the initial ON stages voltage ringing at the switch node may last for over 50 ns with a peak voltage at about 25 V. Both the amplitude and the time duration of the ringing are unacceptable for a number of power supply applications and for system reliability concerns.

Applicants further discovered that the root cause of the ringing is the exchange of energy between parasitic inductances mainly associated with the top clip at input node and the capacitance $C_{OSS}$ across the sync FET.

Applicants solved the ringing problem by introducing a capacitor network connected between $V_{IN}$ and ground, physically adjacent to and in tight proximity with the Buck converter dies. This creates a compact power supply module with the integrated capacitors in parallel with the converter. This capacitor network, properly implemented in the module, channels the ringing energies from the capacitor associated with the sync transistor at the output switch node through the capacitor network into the ground node.

The Applicants are aware that prior attempts in incorporating capacitor networks on the circuit board are ineffective in reducing the ringing because the parasitic inductance associated with the traces that connect the capacitor to the power modules are too high. Even when the capacitors are placed in the power module with bond wires connecting the capacitors to the transistor terminal, their effect on controlling the ringing at the switch node is still inadequate because of the parasitic inductance of the bond wires remain too high.

In order to control the ringing at the switch node, Applicants invented novel methods of fabricating power supply modules. One power module that embodies the invention has a synchronous Buck converter including two MOSFET dies vertically stacked in source-down assembly. The module further includes a metal clip that has a plate portion, an extension portion and a ridge portion. The plate and extension are disposed parallel to and spaced from the leadframe pad, while the ridge is bent from the plate and soldered onto the leads that are connected to $V_{IN}$ pin of the package. At least one capacitor is positioned in the space between the leadframe pad and the clip extension and tied to $V_{IN}$. The synchronous Buck converter is also positioned in the space between the leadframe pad and the clip plate with the drain terminal of the control FET soldered to the clip plate, and the source terminal of the synchronous FET soldered onto the leadframe pad.

Exemplary embodiments to be described in more detail later use MOSFETs in a source-down configuration. But the invention may be implemented in other configurations such as with the MOSFETs in a drain-down configuration, in which the terminal polarities of the MOSFETs are reversed.

Person skilled in the art may also substitute the MOSFETs with bipolar transistors to implement the invention without undue experiments.

BRIEF DESCRIPTION OF THE DRAWINGS

FIGS. 2A, 2B, and 2C display the structure of a synchronous Buck converter module assembly according to the invention.

FIGS. 5A, 5B, 5C, and 5D display the structure of another synchronous Buck converter module assembled according to the invention.

DETAILED DESCRIPTION OF THE PREFERRED EMBODIMENTS

Figure 1:
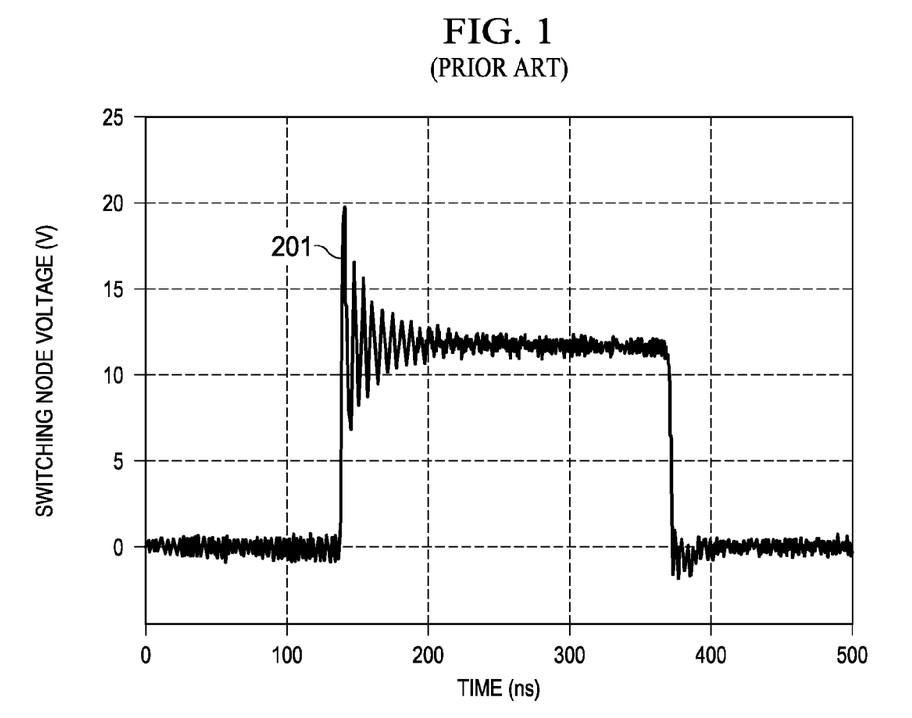
FIG. 1 is a diagram plotting the switch node voltage (in volts) measured as a function of time (in nanoseconds) after onset of a typical synchronous Buck converter.

Applicants observed ringing at the switching node $V_{SW}$ when a typical 12V synchronous Buck converter, constructed with a stacked of two MOSFETs connected by a clip between the drain terminal of the control FET and the $V_{in}$ pin of the power module, is turned on. As depicted in FIG. 1, the voltage swings through rapid excursions up to 25 V before it is damped to its final steady value of 12 V. This voltage ringing at the switch node may last between 60 and 80 ns. The peaks of the strong and long ringing of the switch node voltage could drive the MOSFETS into avalanche and cause damage to the system in which the module is installed.

In a detailed analysis, applicants discovered that the root cause of these $V_{SW}$ ringing is the exchange of energy between the parasitic inductance $L_{SIN}$ associated with the clip that connects the drain terminal of the control FET to the $V_{in}$ and the parasitic capacitance $C_{OSS}$ across the sync FET when it is turned off.

Applicants solved the ringing problem by introducing a capacitor network of capacitors $C_{INT}$ connected between the drain of the control FET and ground, and integrating the capacitor into the converter module by a suitably formed clip, which also is connected to the drain terminal of the control FET. This network, which can have a capacitance over one hundred times larger than that of the $C_{OSS}$, effectively diverts a large portion of the oscillating energy away from the switch node and channel it to ground. The integration of the capacitor is physically adjacent to and in tight proximity (distance in the 250 μm range) with the Buck converter FET dies into a compact power supply module.

In one exemplary implementation, the reduction of the ringing by 80% in amplitude was achieved.

Figure 2A:
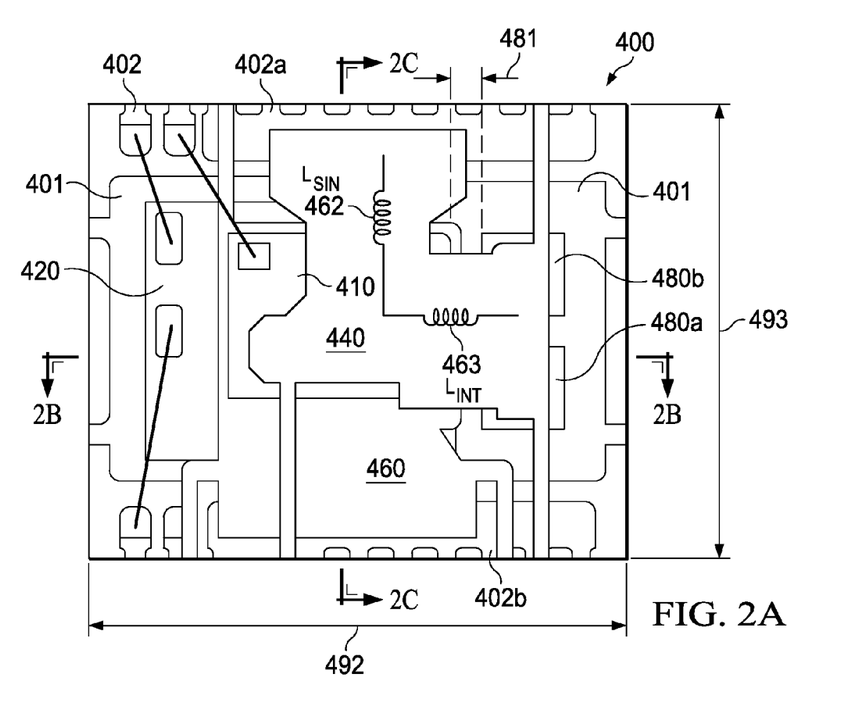
FIG. 2A is a top view of the module through the encapsulating material.
Figure 2B:
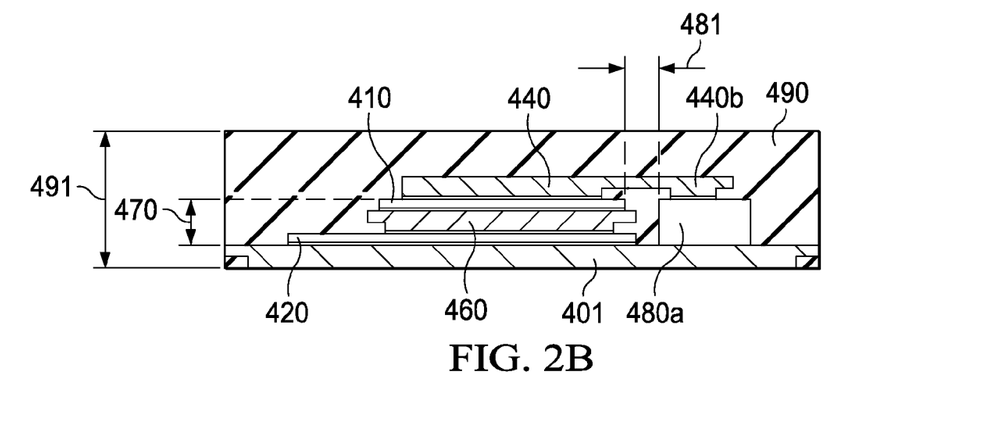
FIG. 2B shows a cross section of the module in FIG. 2A along the cut line 2B-2B of the module.
Figure 2C:
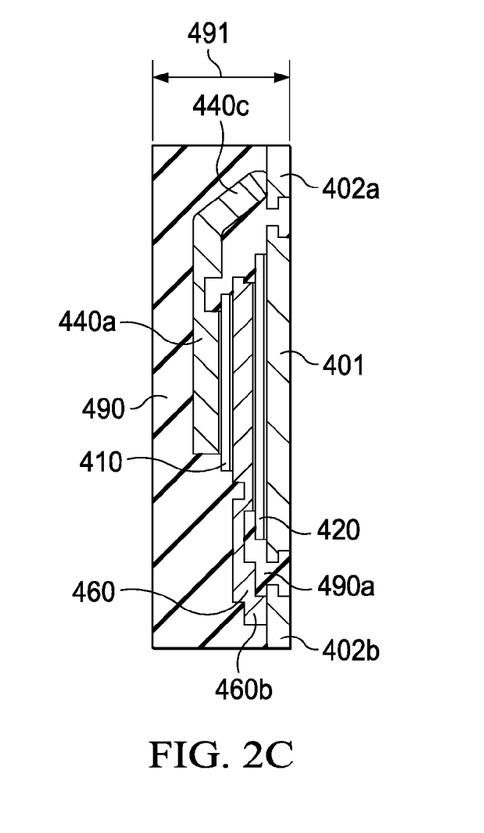
FIG. 2C shows a cross section of the module in FIG. 2A along the cut line 2C-2C of the module.
Figure 3:
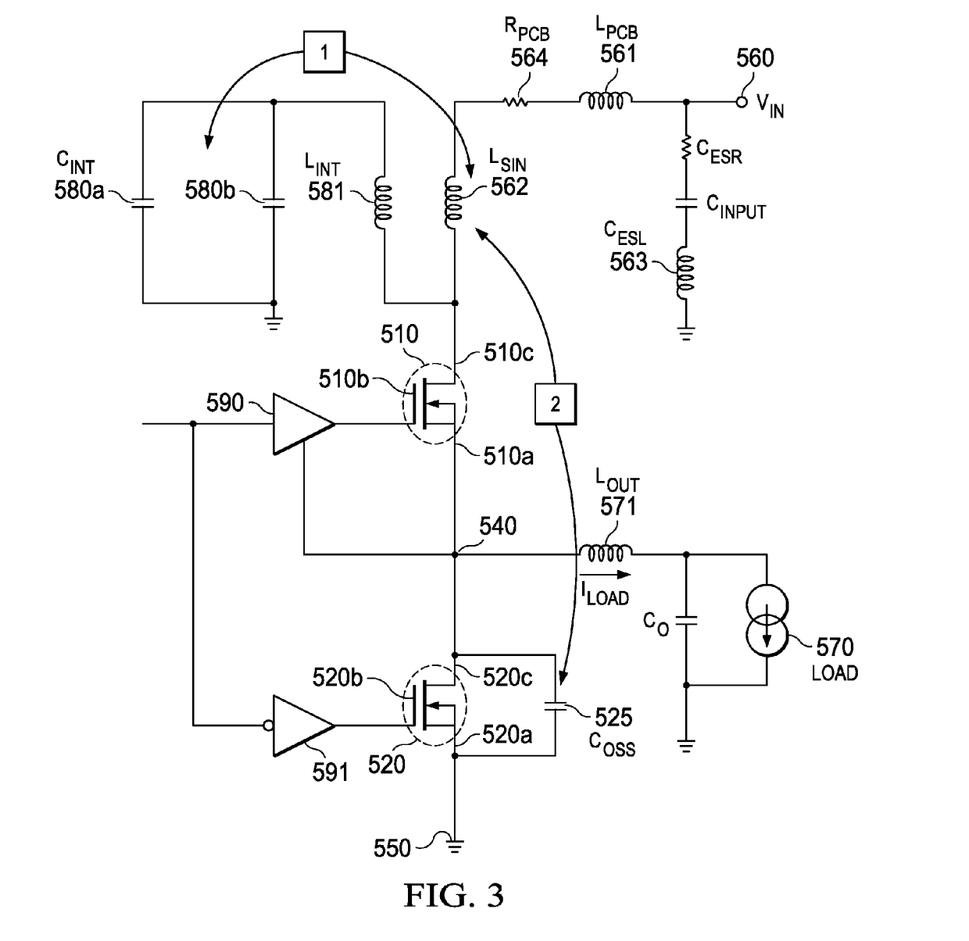
FIG. 3 is a circuit diagram of a synchronous Buck converter according to the invention.

FIGS. 2A, 2B, and 2C illustrate an embodiment of the invention: A capacitor integrated with a 3-dimensional synchronous Buck converter in a power supply module. FIG. 3 is a circuit diagram of the embodiment. It serves as a basis for discussing the benefit of the integrated capacitor network and the design criteria for the connecting clip to maximize the reduction of the ringing.

An embodiment of the invention, shown in FIGS. 2A, 2B, and 2C, displays the construction of an exemplary synchronous Buck converter module generally designated 400. FIG. 2A is a top view of the module and depicts cutaway lines for the cross sections of FIGS. 2B and 2C. Converter 400 has a control MOSFET die 410 stacked upon a sync MOSFET die 420 in source-down configuration. In other embodiments, however, the sync die may be stacked on top of the control die, in a drain-down configuration. Bipolar transistors can also substitute for the MOSFETs in similar constructions.

Since the resistance $R_{ON}$ of the ON state is inversely proportional to the active die area, the duty cycle of the synchronous Buck converter determines the ratio of the active areas needed for the control FET relative to the sync FET. If the anticipated duty cycle is low most of the time (<0.5), the sync FET die 420 should have an active area equal to or larger than the active area of control FET die 410. Consequently, the sync die 420 also has a physical area equal to or larger than the physical area of the control die 410. Control die 410 and sync die 420 have preferably a thickness of about 100 μm; however, other embodiments may have thicker or thinner dies.

FIG. 2A displays two capacitors 480a and 480b positioned adjacent and parallel to the synchronous Buck converter where the control FET die 410 is stacked on top of the sync FET die 420. Both capacitors are in close proximity to the FET dies and to a second clip 460. As an example, distance 481 between capacitor and control die may be 250 μm. Capacitors 480a and 480b are referred to herein as integrated capacitors, since they are integrated into the converter module 400. In other embodiments, only a single capacitor may be used, in still other embodiments, three or more capacitors may be used.

FIGS. 2A, 2B, and 2C further show, in the exemplary embodiment, a metal leadframe with a general QFN-type configuration and a rectangular flat device assembly pad (DAP) 401, destined to be connected to the electrical ground. In other embodiments with drain-down assembly, the leadframe pad may be destined to be connected to the input supply voltage $V_{IN}$. The leads of the leadframe are arranged parallel to two sides of rectangular pad 401. In other embodiments, the leads may be along three or four sides of the pad. Discrete leads are designated 402; other leads are grouped in sets: Set 402a serves as input terminal of the input current from $V_{IN}$; and set 402b serves as terminal to the switch node and to the output terminal. It should be noted that other embodiments may have different lead configurations, especially for specific heat distribution needs. Preferably, the leadframe metal has a thickness of about 200 μm and is made of copper or aluminum or alloys thereof.

The exemplary converter of FIGS. 2A, 2B, and 2C uses two metal clips for electrical connections: the first clip is designated 440, and the second clip is designated 460. The clips have preferably a thickness of about 250 μm and are preferably made of copper or a copper alloy. In the source-down configuration, second clip 460 couples the source terminal of the control die 410 with the drain terminal of the sync die 420.

The preferred method for fabrication clip 460 involves a half-etch technique, which allows the formation of a beam-like ridge (prop) 460b protruding from one side of first clip 460 to facilitate the attachment of the clip 460 to lead set 402b of the leadframe, as depicted in FIG. 2C.

The first clip 440 includes a plate 440a, an extension 440b and a ridge 440c. Plate 440a and extension 440b are parallel to leadframe pad 401 and spaced from leadframe pad 401 by a space 470 to accommodate the thicknesses of control die 410, sync die 420, second clip 460, and the solder layers employed for attachment. In total, space 470 may have a height of about 500 µm. Ridge 440c is bent from plate 440a to an angle so that it can be soldered onto leads 402a in order to connect to the input supply $V_{IN}$.

In order to enable the integration of a capacitor $C_{INT}$ adjacent to the converter, the sync FET die and the control FET die may be positioned as a vertical stack; and the clip connecting the top terminal of the converter may be formed so that it simultaneously connects to leadframe leads as well as to the one or more capacitors $C_{INT}$ in a short path. Further, the capacitors may be designed to fit into the height of the space provided by the stacked MOSFETS. In addition, the terminals of the capacitors may preferably have a metallurgical configuration to allow the usage of the same solder for attachment, which is employed for assembling the converter transistors and clips.

As illustrated in FIG. 2C, a parasitic inductance is correlated with the clip plate 440a and the clip ridge 440c. Clip plate 440a is soldered to control FET die 410, and clip ridge 440c is soldered to leads 402a. This parasitic inductance $L_{SIN}$ is herein referred to as input inductance. Due to the shape of first clip 440, including plate 440a and ridge 440c, input inductance $L_{SIN}$ may have an inductance value of about 550 pH.

FIG. 2B depicts a parasitic inductance $L_{INT}$ (463) correlated with clip extension 440b, which is soldered to integrated capacitors 480a and 480b. Inductance $L_{INT}$ is referred to herein as integrated inductance, since it is correlated with integrated capacitors 480a and 480b. In this exemplary embodiment, the inductance magnitude may be about 130 pH. It is an added advantage of this invention that the value can be controlled by the varying the shape and the thickness of clip extension 440b.

The first clip may also be designed to assist in conducting heat created by the operating converter to a heat sink in the substrate. The first clip may be designed, therefore, to have a large metal area acting as heat spreader and two elongated ridges (props) along opposite clip sides to conduct heat to respective leads and from there to heat sinks in the substrate. In other embodiments with different configuration of the leads, the clip may be designed to have three ridges for enhanced heat removal from the converter; in yet other embodiments, one ridge may suffice. The ridges are formed tall enough so that they can be soldered to lead sets on opposite sides of the leadframe pad. The preferred method of fabricating the clip with ridges is a half-etching technique applied to a metal sheet. Stamping and coining may also be used to make the clip.

Preferably the connections between leadframe, FET dies, and clips are joined by solder to reduce parasitic impedances and inductances. More preferably, only a single solder material is selected so that all solder can be reflowed at the same reflow temperature and in a single process step.

The stacked MOSFETS are preferably encapsulated in a protective packaging compound 490 to form a module. The preferred encapsulation method is a molding technique. In the embodiment of FIGS. 2B and 2C, the thickness 491 of the molded module is about 1.5 mm. Since clips 440 and 460, as mentioned above, are preferably fabricated by a half-etch technique, it is advantageous to fill any space opened by the half-etch preparation, such as gaps 490a, with encapsulation compound in order to enhance the robustness of the encapsulated module. Typical dimensions of a molded package are as follows: length 492 about 6 mm, width 493 about 5 mm.

FIG. 3 is a circuit diagram of the exemplary synchronous Buck converter as depicted in FIGS. 2A, 2B, and 2C. Highlighted are circuits [1] and [2] with oscillating electric energies at the onset of the switching cycle. In circuit [2], electrical energy may exchange between the input inductance $L_{SIN}$ (562, about 550 pH) and the parasitic output capacitance $C_{OSS}$ (525, about 90 pF) of the sync FET (520). This is the source of the ringing phenomenon. In circuit [1], by introducing integrated capacitors $C_{INT}$ (580a and 580b, about 10 to 15 nF total), the ringing energies may be diverted through the $C_{INT}$ (580a and 580b) to ground and therefore reduces the oscillation of at $V_{SW}$. Integrated inductance $L_{INT}$ (581) is the parasitic inductance associated with the clip extension portion connected to the capacitors. Further listed in FIG. 3 are the sync FET (520) and the control FET (510), the input capacitor $C_{ESL}$ (563), and the printed circuit board inductance $L_{PCB}$ (561).

As FIG. 3 shows, an input current flowing from supply $V_{IN}$ (560) to the drain 510c of control FET 510 encounters a printed circuit board inductance $L_{PCB}$ (561) between about 100 and 200 pH, a printed circuit board resistance $R_{PCB}$ (564) of about 0.2 mΩ, and the input inductance (first clip inductance) $L_{SIN}$ (562) of about 550 pH.

Gate 510b is connected to a respective lead of the leadframe and then to driver 590. The parasitic inductance at the source 510a is negligible because it is directly connected to the second clip 460 (see FIGS. 2A, 2B, 2C).

Gate 520b is connected to a respective lead of the leadframe and then to driver 591. The load current $I_{LOAD}$ of the converter flows from switch node 540 through second clip 460, attached to a respective lead of the leadframe, to an output inductor $L_{OUT}$ (571) and a load (570).

In the exemplary power module, several components can be designed for the control of the ringing at the switch node. They include the size of the capacitors and the geometries of the clip that connect the capacitors to the control FET. For example, at a switch frequency of 500 KHz, with the active area of the control FET at 3.9 mm$^2$ and the active area of the sync FET at 8.5 mm$^2$, integrated capacitance $C_{INT}$ about 5 and 15 nF and a clip designed for 180 pH prove to lower excursion at the switch node from more than 21 V to between about 14 to 16 V. While capacitors of around 10 nF are commercially available, a connector with self inductance lower than 200 pH is difficult to realize. For example, one can not achieve the desired inductance if the capacitors are connected by bond wires, which has been attempted before. It is because with a typical bond wire of 25 µm in diameter, even if the wire connection is only 1 mm in length, the resulting self inductance will have about 1 nH—about 5 times higher than what is desired, and which is much too high for the purpose of reducing the ringing at the switch node.

It should be pointed out that in certain embodiments only a single integrated capacitor $C_{INT}$ is employed for circuit [1]. In still other embodiments, two capacitors are employed, and they may be positioned on opposite sides of the module as depicted in FIG. 5B.

Figure 4:
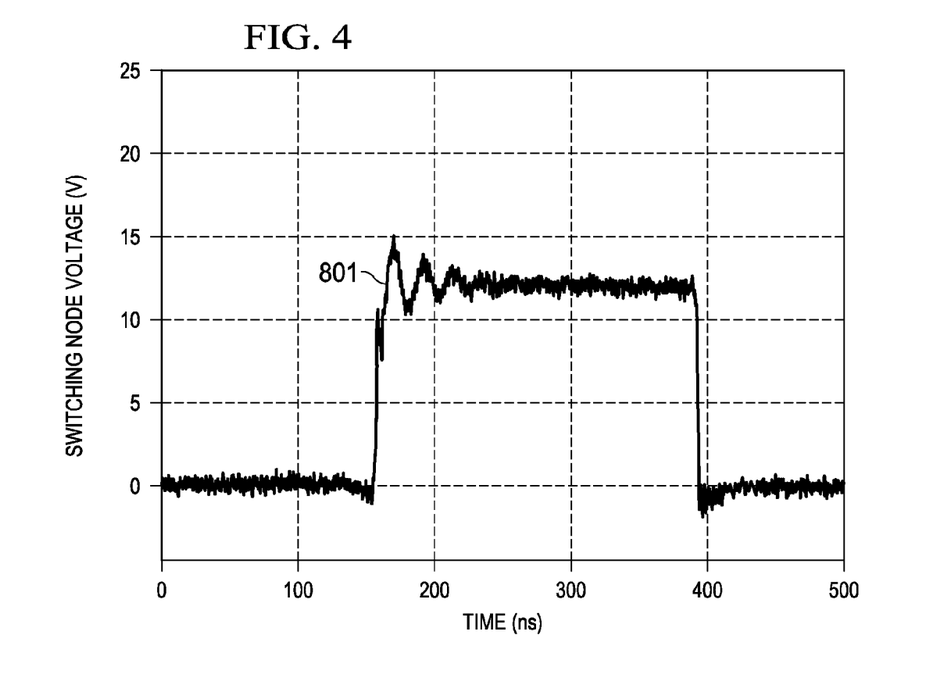
FIG. 4 is a diagram plotting the switch node voltage (in volt) as a function of time (in nanosecond) after onset of a synchronous Buck converter as shown in FIGS. 2A, 2B, and 2C.

When an exemplary synchronous Buck converter as shown in FIGS. 2A, 2B, and 2C is in operation, onsets of the switch node voltage waveform $V_{SW}$ 801 as a function of time have been observed as plotted in FIG. 4. As FIG. 4 shows, the voltage swings through a few minor excursions up to 14.8 V, before it is quickly damped to its final steady value of 12 V.

FIGS. 5A, 5B, 5C, and 5D illustrate yet another embodiment, generally designated 900. Encapsulation 990 is depicted in transparency in FIG. 5B. The exemplary module has a thickness 991 of 1.5 mm, a module length 992 of 6 mm and a width 993 of 5 mm. The metal leadframe, suitable for Quad Flat No-Lead (QFN) and Small Outline No-Lead (SON) type modules, includes a rectangular pad 901 and a plurality of leads 902. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. Preferred thickness of the leadframe metal for the exemplary embodiment shown in FIG. 5 is 0.2 mm; other embodiments may use thinner or thicker leadframe metal. From the standpoint of low cost and batch processing, it is preferred to start with sheet metal and fabricate the leadframe as a strip by stamping or etching, and to singulate the leadframe for the module by trimming the strip after the encapsulation process.

Figure 5A:
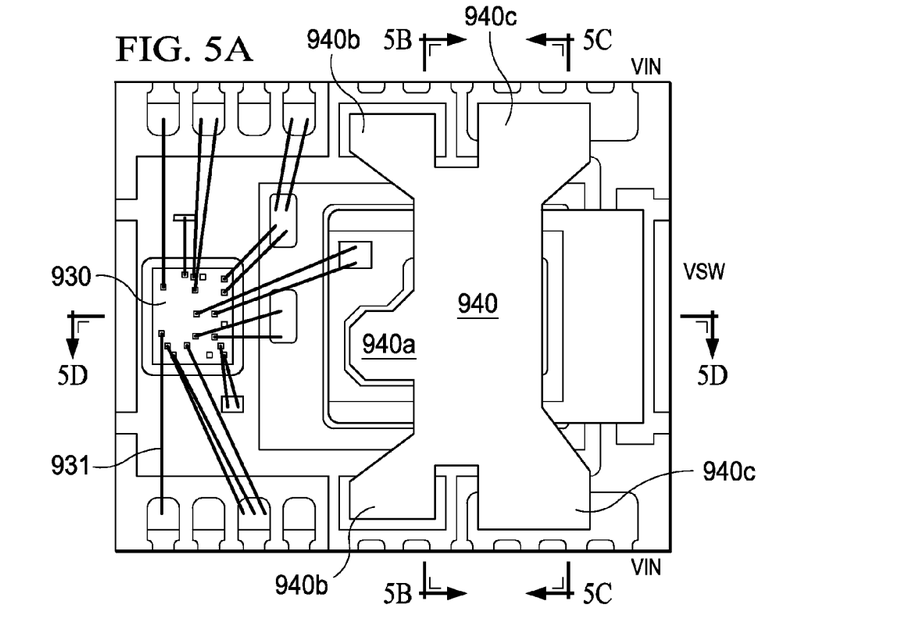
FIG. 5A is a top view of the module through an encapsulation material.
Figure 5B:
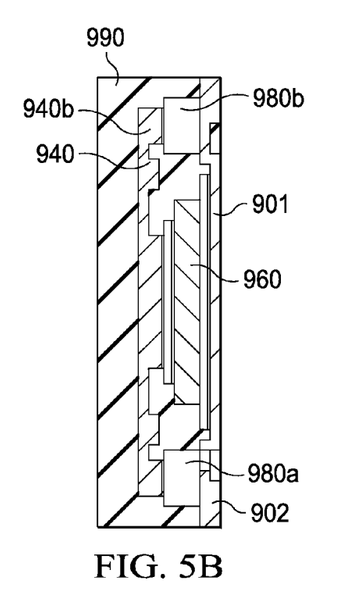
FIG. 5B shows a cross section of the module of FIG. 5A along the cut line 5B-5B of the module.
Figure 5C:
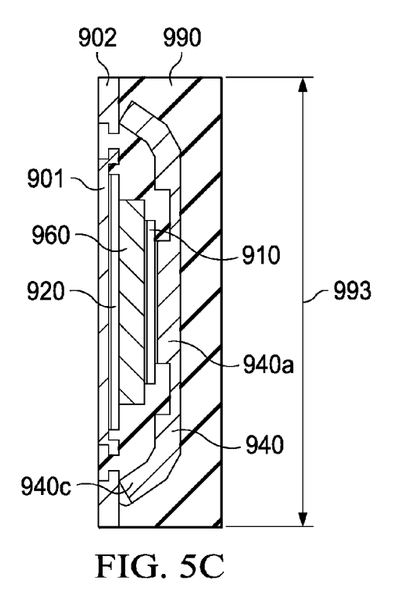
FIG. 5C illustrates a cross section of the module of FIG. 5A along the cut line 5C-5C of the module.
Figure 5D:
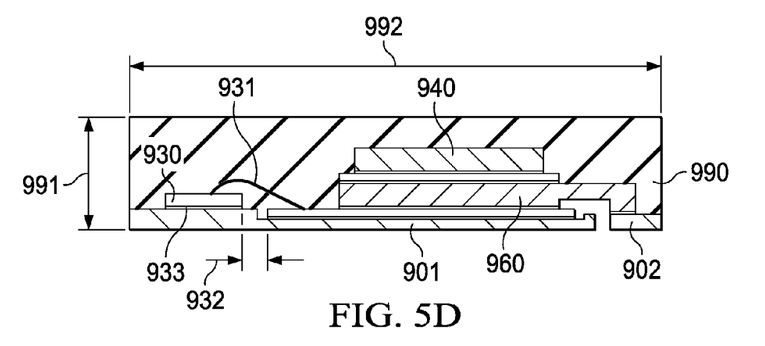
FIG. 5D shows a cross section of the module of FIG. 5A along the cut line 5D-5D of the module.

As FIGS. 5B, 5C, and 5D indicate, the central portion of leadframe pad 901 has reduced thickness compared to the leads of the leadframe, achieved by partial etching (half etching) of the leadframe portion. The resulting indent is used to downset the sync FET die and thus help to reduce the overall module thickness 991. In yet other embodiments, even the pad portion for the one or more integrated capacitors may be thinned. First clip is designated 940, second clip (switch node clip) is designated 960.

The control FET die 910 and the sync FET die 920 are assembled as a vertical stack; sync die 920 is attached to pad 901, preferably by a solder layer. As an example, sync die 920 may have a size of about 3.5×2.8 mm, and a thickness of 0.1 mm. In other examples, die size and die thickness may vary to smaller or to greater values. The solder material, for instance a solder paste, is selected so that the same material can be used for all solder joints of the power supply module 900, allowing a single solder reflow step for assembling the module.

In FIGS. 5A, 5B, and 5C, first clip 940 has a 3-dimensional configuration with an outline to fulfill its various functions: Clip plate 940a in combination with clip ridge 940c establishes input inductance $L_{SIN}$; clip extension 940b establishes integrated inductance $L_{INT}$; and the clip surfaces are metallurgically prepared, preferably by deposition of suitable metal layers, to enable reliable solderability. First clip 940 is preferably made of copper and has a thickness before half-etching of about 0.25 mm; other embodiments may have thicker or thinner clips.

As FIG. 5B indicates, module 900 has two integrated capacitors 980a and 980b attached to the leadframe pad on opposite sides of the leadframe. The arrangement is so designed for attaching the additional chip 930, which includes the driver and controller of the power supply module. Chip 930 may be connected by bonding wires 931 to respective leads and die terminals. Preferred size of a single capacitor is between about 0.8×0.8 and 1.0×1.0 mm. The module may also have rectangular outline. The preferred capacitor thickness is about 0.5 mm; other embodiments may have thicker or thinner capacitors. The capacitor terminals are preferably metalized to render them solderable. First clip extensions 940b are attached to the integrated capacitors 980a and 980b so that the branch including the integrated inductors $L_{INT}$ of a desired inductance.

As depicted in FIGS. 5A and 5D, in close proximity (distance 932 is about 300 μm) to the vertically stacked FET dies is a silicon integrated circuit chip 930, providing driver and controller functions for the power supply system. Chip 930 has back side metallization to allow attachment to leadframe pad 901 by solder layer 933, which is preferably about 25 μm thick. The metallic solder provides high thermal conductivity for spreading heat from chip 230 to pad 201. In the exemplary embodiment shown in FIGS. 5A and 5D, chip 230 is rectangular shaped and 0.2 mm thick; in other embodiments, chip 930 may be as thin as control and sync dies.

As depicted in FIGS. 5A and 5D, the terminals of chip 930 are bonded by wires 931 to the respective leads and die terminals. The difference between the width of rectangular pad 901 and the relatively smaller side length of chip 930 provides a distance between chip terminals and leads. This distance stretches the wire spans from chip terminals to respective leads such that any height difference due to the thickness of chip 930 becomes insignificant. Consequently, the wire connections 931 can be provided without downhill bonding, enhancing the reliability of the module assembly. The preferred diameter of bonding wires 931 is about 25 μm, but wires smaller or greater may also be used.

In other embodiments, only a single integrated capacitor may be used.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors, such as bipolar transistors.

As another example, the high current capability of the power supply module can be further extended, and the efficiency further enhanced, by leaving the top surface of the second clip un-encapsulated so that the second clip can be connected to a heat sink, preferably by soldering. In this configuration, the module can dissipate its heat from both surfaces to heat sinks.

As yet another example, three or more capacitors $C_{INT}$ may be integrated into the power supply module, together with respective parasitic resistances and parasitic inductances.

It is therefore intended that the appended claims encompass any such modifications or embodiments.

We claim:

1. A power supply module comprising:
   a first metallic clip having a plate portion soldered to a terminal of a first transistor chip, the first metallic clip comprising:
   an extension portion soldered to a capacitor having a bottom surface co-planar with a bottom surface of a second transistor chip connected to the first transistor in a stack; and a ridge portion soldered to a leadframe.

2. The power module of claim 1, further comprising a second metallic clip soldered to the first transistor chip on a first surface and to the second transistor chip on a second surface opposite the first surface.

3. The power module of claim 2, in which the first transistor is a MOSFET having a drain terminal soldered to the first metallic clip.

4. The power module of claim 2, in which the first transistor chip further has a source terminal soldered to the second metallic clip.

5. The power module of claim 2, in which the second transistor is a MOSFET having a drain terminal soldered the second metallic clip.

6. The power module of claim 1, in which the first transistor and the second transistor have gate terminals wirebonded to the leadframe.

7. A power supply module comprising:
a first metallic clip comprising:
a plate portion soldered to a terminal of a first transistor chip;
an extension portion soldered to a capacitor;
a ridge portion soldered to a leadframe;
a second transistor connected to the first transistor in a stack, the second transistor having a source terminal soldered to the leadframe.

8. The power module of claim 7, in which the second transistor is a MOSFET having a drain terminal soldered the second metallic clip.

9. A power supply module comprising;
a first metallic clip comprising:
a plate portion soldered to a terminal of a first transistor chip;
an extension portion soldered to a capacitor;
a ridge portion soldered to a leadframe;
a second transistor chip connected to the first transistor in a stack;
a second metallic clip soldered to the first transistor chip on a first surface and to the second transistor chip on a second surface opposite the first surface; and
a third semiconductor chip wirebonded to a gate terminal of the first transistor chip and wirebonded to the second transistor chip.

10. A power supply module comprising:
a first metallic clip comprising:
a plate portion soldered to a terminal of a first transistor chip;
an extension portion soldered to a capacitor;
a ridge portion soldered to a leadframe; and
a second transistor wirebonded to the leadframe and wirebonded to a gate terminal of the first transistor in a stack.

11. The power module of claim 10, further comprising a third semiconductor chip wirebonded to a gate terminal of the first transistor chip and wirebonded to the second transistor chip.

12. A module comprising:
a leadframe;
a first metallic clip comprising:
a plate portion coupled to a field effect transistor terminal of a first MOSFET transistor chip; and
an extension portion connected to a capacitor integrated between the extension and the leadframe.

13. The module of claim 12, further comprising a second MOSFET transistor chip coupled to the first MOSFET transistor in a stack.

14. The module of claim 13, further comprising a second metallic clip coupled to the first MOSFET transistor chip on a first surface and to the second MOSFET transistor chip on a second surface opposite the first surface.

15. The module of claim 13, in which the second MOSFET transistor having a drain terminal soldered the second metallic clip.

16. The module of claim 13, in which the first MOSFET transistor and the second MOSFET transistor have gate terminals wirebonded to the leadframe.

17. The module of claim 12, in which the first MOSFET transistor having a drain terminal soldered to the first metallic clip.

18. The module of claim 17, in which the first MOSFET transistor chip further has a source terminal soldered to the second metallic clip.

* * * * *